United States Patent [19]

Prentice et al.

[11] Patent Number: 4,590,664
[45] Date of Patent: May 27, 1986

[54] METHOD OF FABRICATING LOW NOISE REFERENCE DIODES AND TRANSISTORS

[75] Inventors: John S. Prentice, Palm Bay; Gabriel J. Uscategui, Melbourne, both of Fla.

[73] Assignee: Harris Corporation, Melbourne, Fla.

[21] Appl. No.: 518,598

[22] Filed: Jul. 29, 1983

[51] Int. Cl.⁴ .................. H01L 21/04; H01L 29/40
[52] U.S. Cl. ........................... 29/571; 29/578; 29/591; 148/1.5; 357/34; 357/55
[58] Field of Search ............. 29/571, 578, 591; 357/13, 34, 53, 55; 148/1.5

[56] References Cited

U.S. PATENT DOCUMENTS

| | | | |
|---|---|---|---|
| 3,204,160 | 8/1965 | Sah | 357/53 X |
| 3,576,684 | 4/1971 | Mehta et al. | 357/13 X |
| 3,717,516 | 2/1973 | Hatcher, Jr. et al. | 148/187 |
| 3,719,535 | 3/1973 | Zoroglu | 29/578 X |
| 3,814,997 | 6/1974 | Takahashi et al. | 357/13 X |
| 3,845,495 | 10/1974 | Cauge et al. | 357/53 X |
| 3,909,119 | 9/1975 | Wolley | 357/13 |
| 4,009,481 | 2/1977 | Reindl | 357/53 X |
| 4,050,965 | 9/1977 | Ipri et al. | 148/175 |
| 4,089,022 | 5/1978 | Asai et al. | 357/23 |
| 4,454,524 | 6/1984 | Spence | 357/13 X |

Primary Examiner—Brian E. Hearn
Assistant Examiner—David A. Hey
Attorney, Agent, or Firm—Barnes & Thornburg

[57] ABSTRACT

The thick oxide over the surface portion of a P/N junction of a reference diode is removed, a thin oxide is grown thereon, and a contaminated shield layer is formed on the thin oxide. In addition to improving the reversed biased diode, the same method improves the forward biased emitter-base surface junction of a vertical bipolar transistor. The shield layer may be biased separate from the transistor.

27 Claims, 14 Drawing Figures

THIN OXIDE

THIN OXIDE WITH
METAL SHIELD

METHOD OF FABRICATING LOW NOISE REFERENCE DIODES AND TRANSISTORS

BACKGROUND OF THE INVENTION

The present invention relates generally to reference diodes and transistors and more specifically to improved low noise diodes and transistors.

Reference diodes are used to generate reference voltages for analog/digital converters, voltage regulated power supplies and bias networks for operational amplifiers. The simplest construction for such a diode as part of an integrated circuit is to use the emitter-base junction of an NPN or PNP bipolar transistor or to abut N+ and P+ diffusions. A limitation to the usefulness of such a reference diode is its noise voltage. Since the doping concentrations are greatest at the surface, the junction breakdown occurs at the surface. Therefore, the properties of the silicon/oxide interface affect the stability and noise of the diode breakdown voltage.

In discussing the problems of manufacturing zener diodes, Hatcher Jr. et al. in U.S. Pat. No. 3,717,516 provides a method for controlling the reverse breakdown characteristics by controlling the oxidation of the surface and the impurity diffusion to modify the impurity-density profile at the surface of the wafer. The high impurity region 16 in combination with the low impurity region 17 produces the desired steep impurity gradient required for high breakdown voltages. Although addressing the problem of controlling the reverse breakdown characteristics of the zener diode, Hatcher Jr. et al. does not discuss or consider solution of the low frequency noise of the diode breakdown voltage.

Another solution of the prior art to avoid the problems of the silicon/oxide interface is to use a buried reference diode. With an extra deep N+ or P+ diffusion capped by an opposite P+ or N+ diffusion, the reference diodes can be constructed which have the maximum doping concentration, and consequently high breakdown voltage occuring well below the silicon-oxide interface. Such subsurface or "buried" diodes are quieter. However, this extra deep N+ or P+ diffusion step makes the associated integrated circuits more expensive to fabricate. A typical example is illustrated in U.S. Pat. No. 3,909,119 to Wholley. This patent is directed to a guarded planar P/N junction semiconductor device wherein the field plate is provided and biased to extend the depletion region into the lighter doped material surrounding the buried junction device. Wholley applies his invention to buried diodes and the base-collector junction of a transistor. This increases the reverse breakdown voltage of the high voltage reference diodes but does not address or correct the low frequency noise problems. Extending the depletion region into the base region moves the maximum field region away from the surface which does tend to lower the noise. However, extending the depletion region into the base region also increases the number of surface trap sites that contribute to noise. Thus a Wholley type of device, although increasing the breakdown voltage, adds to the noise problem.

The use of a gate electrode over the emitter-base junction is known in lateral bipolar transistors as exemplified by U.S. Pat. Nos. 4,089,022 and 4,050,965. The gates in these patents are also used as masks in forming regions of the transistor.

SUMMARY OF THE INVENTION

An object of the present invention is to provide a method of manufacturing inexpensively low noise reference diodes and transistors.

Another object of the present invention is to provide a method of manufacturing low surface noise reference diodes and transistors.

Still another object of the present invention is to provide a method of fabricating low surface noise reference diodes and transistors which are compatible with existing fabrication techniques requiring no additional steps.

These and other object of the invention are attained by removing the field oxide from the surface of the substrate over the surface P/N junction of the diode followed by controlled oxidation of the surface to form a silicon/oxide interface having fewer defects and covering the thin oxide with a shield layer. The P/N junction may be two high impurity concentration P and N type regions forming only a vertical junction or a high impurity P or N junction in an N or P region respectively. The shield layer may be formed of a conductive material which is independently biased relative to the anode or cathode of the diode or may be commonly biased with the higher impurity anode or cathode region. Preferably the shield layer is a doped polycrystalline material, or metal such as aluminum.

As a reference diode, the resulting structure provides a low noise reverse biased operation.

In a transistor, the thin oxide and shield are formed over the emitter-base surface junction. The shield being a conductive layer encompasses the emitter region and provides a separate and distinct contact which can be biased to effect the noise of the forward biased emitter-base junction. For PNP transistors, no biasing is necessary and for NPN transistors, the sheild should be biased more negative than the emitter relative to the base.

Other objects, advantages and novel features of the present invention will become apparent from the following detailed description of the invention when considered in conjunction with the accompanying drawings.

DETAILED DESCRIPTION OF THE DRAWINGS

Figure 1:
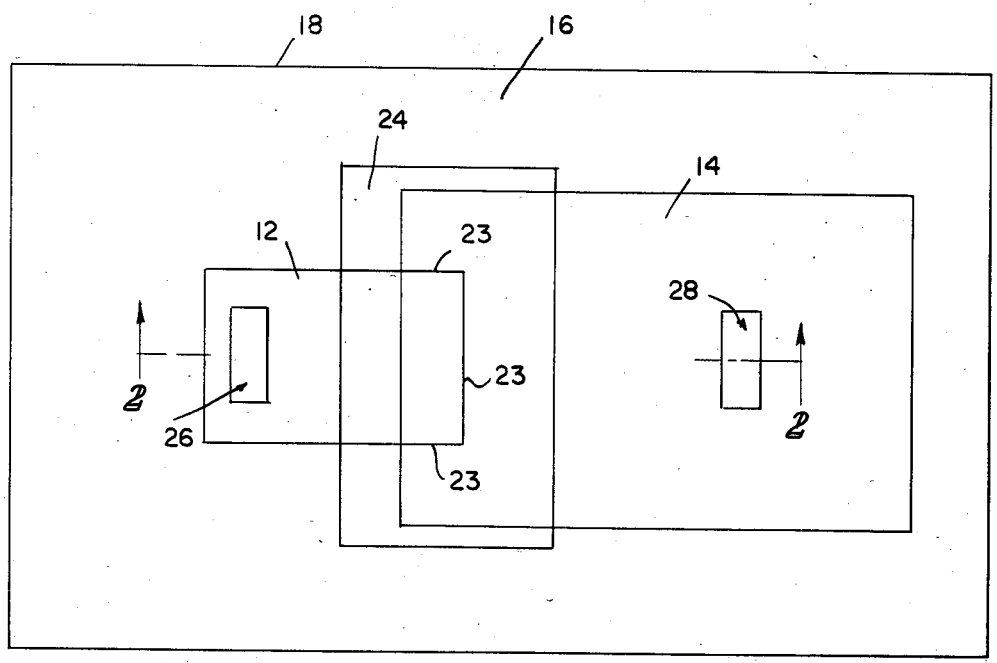
FIG. 1 is a plan view of a zener diode incorporating the principles of the present invention.
Figure 2:
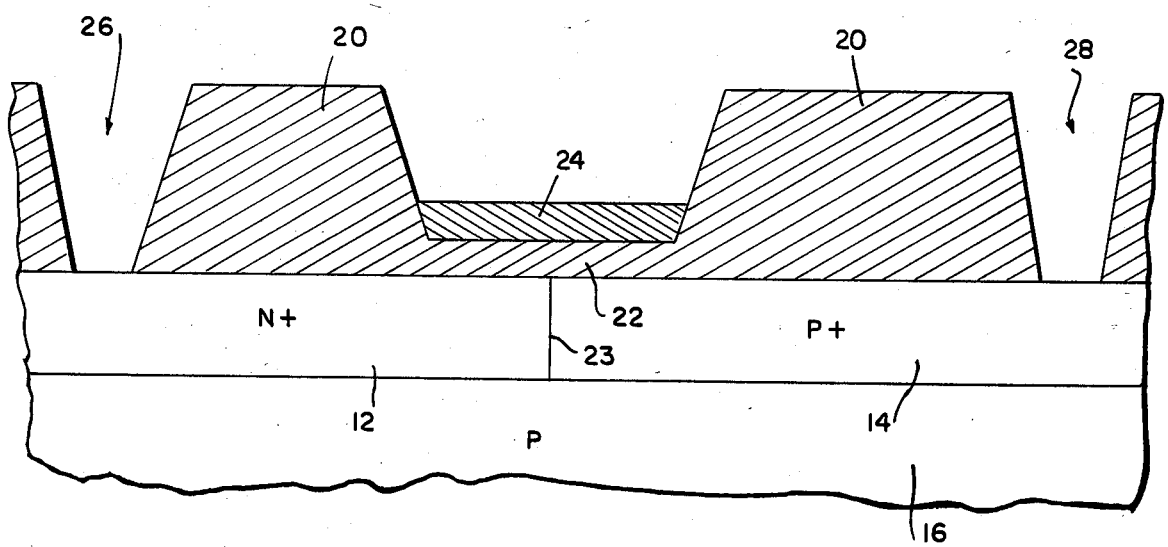
FIG. 2 is a cross-sectional view taken along lines 2—2 of FIG. 1.

A zener diode as illustrated in FIGS. 1 and 2 includes an N+ region 12 and a P+ region 14 formed in a P region 16. The P region 16 may lie in an N substrate 18. A field oxide 20 is formed on a surface of the substrate and a thin oxide region 22 is formed over the surface junction 23 of the N+ region and P+ region 14. A shielding layer 24 is formed over the thin oxide region 22. A cathode contact aperture 26 and anode contact aperture 28 are provided in the thick field oxide 20 exposing the surface regions of N+ region 12 and P+ region 14 respectively. Metalization is not shown in FIGS. 1 and 2 for the sake of clarity. As will be explained in more detail below, the formation of the thin oxide region 22 decreases contaminants such as sodium and traps at the surface of the P/N junction of the diode and the shield layer 24 guards the junction from subsequent contaminants. This reduces the low frequency noise of the breakdown of the zener diode and thereby minimizes the effect of the silicon/oxide interface on the diode breakdown voltage characteristics.

Figure 3:
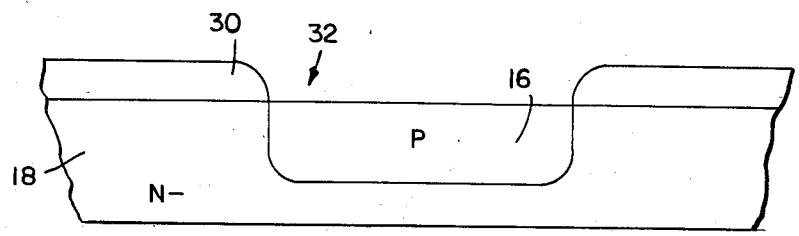
FIGS. 3-7 are cross-sectional views of a wafer illustrating different stages of fabrication.

The process of fabricating the diode of FIGS. 1 and 2 begins as illustrated in FIG. 3 by forming a masking layer 30 on the N- substrate region 18 having an aperture 32 therein. P type impurities are introduced and diffused to form P region 16. It should be noted that P region 16 has an impurity concentration in the range of $10^{16}$ to $10^{18}$ atoms per cubic centimeter and is equivalent to or may be formed at the same time as the base region of an NPN transistor. Also it may be the well region in which an N channel MOS device may be formed.

Figure 4:
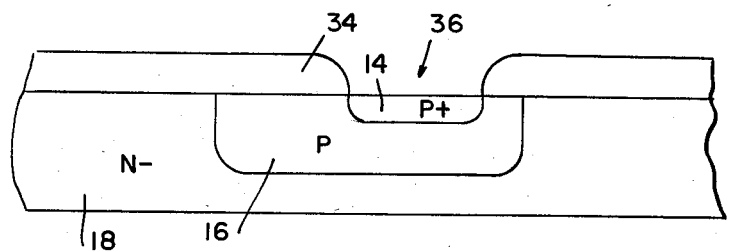

The surface of the substrate is then covered with a masking layer 34 having an aperture 36 therein through which P type impurities are introduced and diffused to form the P+ region 14 having an impurity concentration in the range of $10^{20}$ to $10^{21}$ atoms per cubic centimeter. The masking layer 34 may be an extension of the original masking layer 30 or may be a new masking layer. The wafer at this stage is illustrated in FIG. 4.

Figure 5:
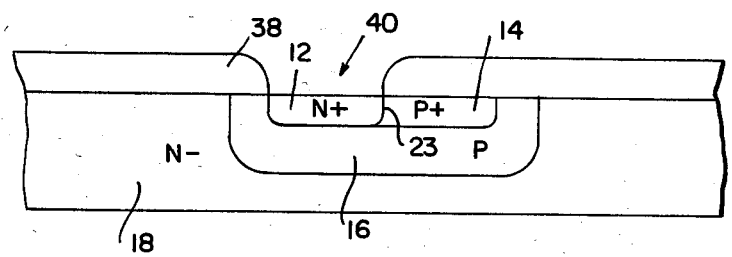

A masking layer 38 is provided on the surface of the substrate having an aperture 40 therein through which N type impurities are introduced and diffused to form the N+ region 12 having an impurity concentration in the range of $5 \times 10^{20}$ to $5 \times 10^{21}$ atoms per cubic centimeter. The resulting N+ region 12 has a vertical junction 23 with the P+ region 14. As with the previous masking layer, masking layer 38 may be an extension of the original masking layers 30 and/or 34 or may be a completely new masking layer. The N+ and P+ regions 12 and 14 may be emitter or base contact regions of bipolar transistors or may be the equivalent of and form simultaneously with the source and drain regions of MOS transistors. The wafer at this stage of development is illustrated specifically in FIG. 5.

Figure 6:
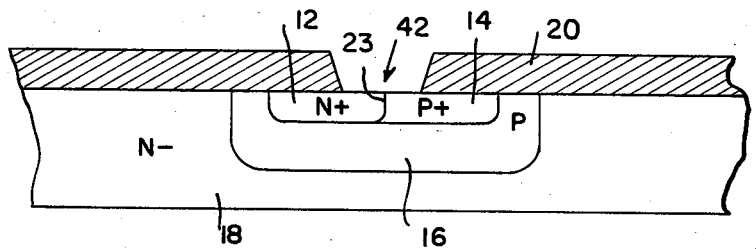
Figure 7:
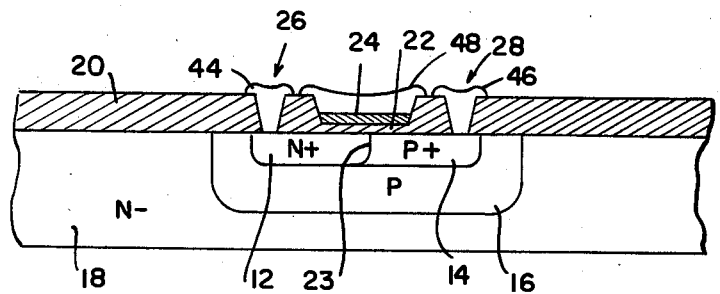

The masking layer 38 is then removed and a thick layer of field oxide 20 is grown on the surface of the substrate. Alternatively, the thick oxide layer 20 may be a further oxidation of the previous mask 38. The oxide 20 is removed to form an aperture 42 above and contiguous to the surface junction 23 of the N+ region 12 and P+ region 14. The wafer at this stage of fabrication is illustrated in FIG. 6.

Impurities and contaminants in the original thick oxide layer 20 as well as the surface states caused by the disarray of the silicon/oxygen bonds in the first few hundred angstroms of oxide are removed from the surface of the wafer by the removal of the oxide above the junction 23. The wafer is then subjected to A controlled oxidation environment until a thin oxide layer 22 as illustrated in FIG. 2 is grown. The etching and oxidation is the same as that used to form insulated gate field effect transistors as well as surface capacitors. A typical example is to expose the wafer to a gaseous environment of $H_2/O_2$ at a temperature of 850° C.–950° C. for a period of 15–60 minutes to form a thin oxide region under 2,000 angstroms and preferably in the range of 500 to 1500 angstroms. The thin oxide region 22 results in silicon-oxide interface above the surface junction 23 having fewer trapping sites because of the removal of defects and the controlled oxidation. This contributes to the reduction of the low frequency noise and burst noise.

A shield layer 24, for example doped poly-crystalline silicon, is formed over the thin oxide layer 22 to act as a barrier between the thin oxide and the ambient and subsequent environments to keep the thin oxide and subsequently the oxide silicon interface clean. The wafer is subjected to an oxidation to cover the shield layer 24. Contact apertures 26 and 28 are formed in the oxide layer 20 and the layer over the shield layer 24 (not shown) and metalization is performed to provide cathode contact 44, anode contact 46 and shield region contact 48. If desired, the shield region may be biased, although this has little or no effect on the breakdown voltage because of the high impurity concentration of N+ region 12 and P+ region 14. The importance being that the N+ region 12 and the P+ region 14 have a minimum impurity concentration of $10^{20}$ atoms per cubic centimeter. This provides the desired high breakdown zener diodes.

Figure 8:
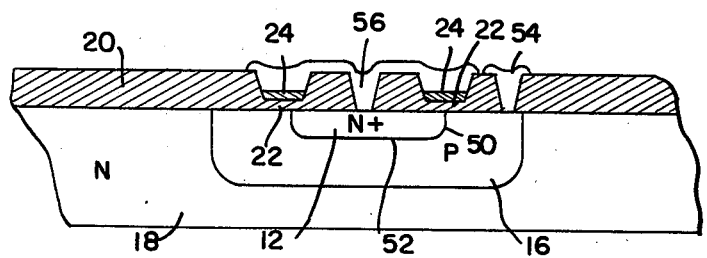
FIG. 8 is a cross-section view of another embodiment of a diode incorporating the principles of the present invention.

Alternatively, the reference diode of the present invention may be formed from the emitter and base diffusions. As illustrated in FIG. 8, the N+ region 12 is formed in the P base region 16 resulting in a vertical junction 50 and a horizontal junction 52. The thin oxide layer 22 is formed above the vertical junction portion 50 with the shield layer 24 thereon. The anode contact 54 is formed directly to base region 16 and a common cathode and shield contact 56 are formed to the N+ region 12 and the shield layer 24. The impurity concentration of the P base region 16 should be at a maximum of $5 \times 10^{18}$ atoms per cubic centimeter to assure a breakdown voltage of under approximately 8 volts. Although FIG. 8 has illustrated an N emitter and a P base, it is evident that the reference diode may be formed with a P+ emitter region and an N base. Also, the cathode 12 and the shield layer 24 may have separate contacts. The cathode region 12 and anode region 16 are reverse biased so that the diode operates in reverse breakdown, which is opposite to the biasing and operation of these regions as emitter and base of a transistor.

Figure 9:
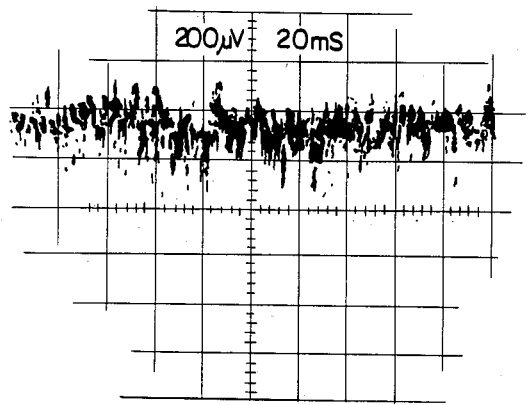
FIG. 9 is a graph of the voltage of a prior art surface diode.
Figure 10:
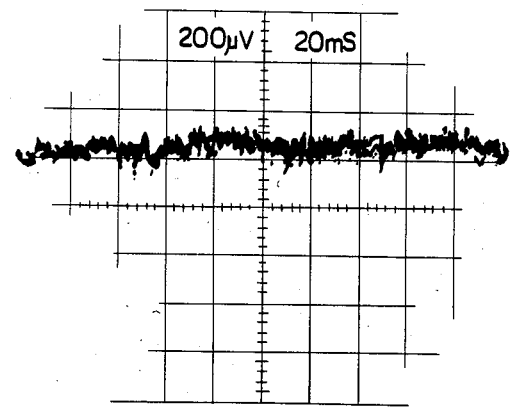
FIG. 10 is a graph of the voltage across a diode of the present invention having thin oxide.
Figure 11:
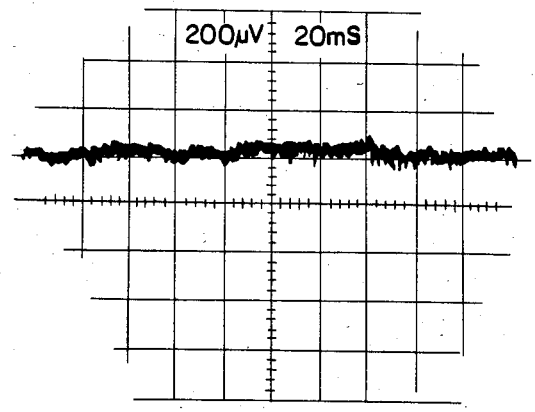
FIG. 11 is a graph of the voltage across a diode of the present invention having thin oxide covered by a metal shield.

A comparison of the operating characteristics of a surface junction reference diode of the prior art versus a diode built according to the principles of the present invention is illustrated in FIGS. 9 through 11. To eliminate any process control variations, the diodes of FIGS. 9 through 11 were formed simultaneously on the same wafer of the same geometry with the appropriate post impurity introduction steps as noted. The prior art diode of FIG. 9 shows substantial modulation or noise. FIG. 10 illustrates that growing the thin oxide region over the surface junction without a shield results in substantial noise reduction. The use of a metal shield layer over the thin oxide region further reduces the noise as illustrated in FIG. 11.

Figure 12:
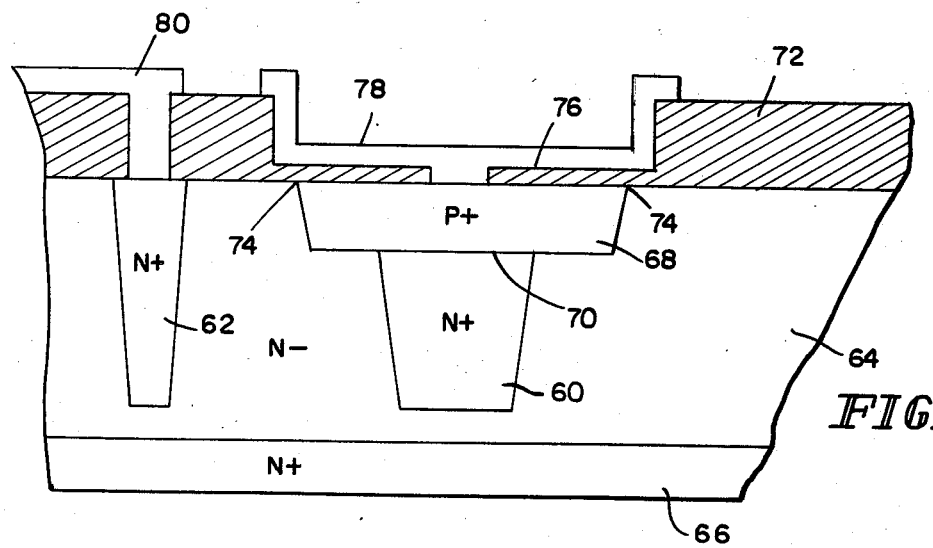
FIG. 12 is a cross-sectional view of a buried zener diode incorporating the principles of the present invention.

Although the present invention was initially developed for surface junction reference diodes, the principle is also applicable to buried junction diodes as illustrated in FIG. 12. The diode is fabricated by introducing N type impurities to form a deep N+ cathode region 60 and cathode contact region 62 in a lightly doped N− layer 64 which may include a buried highly doped N+ region 66. P type impurities are introduced to form the highly doped P+ anode region 68 over cathode region 60. The anode region 68 has a greater lateral area than cathode region 60 and forms a buried junction 70 therewith displaced from the surface of the layer 64. The thick oxide layer 72 is formed on the surface of layer 64 and an opening is formed to expose the surface junction 74 of the N− layer 64 and P+ anode region 68. In the example of FIG. 12 the opening also exposes the total anode region 68. A thin oxide layer 76 is grown and a shield layer 78 is formed on the thin oxide 76. In the example of FIG. 12, a contact aperture is formed in the thin oxide 76 and in the thick oxide 72. The cathode contact 80, and the integral anode contact and shield 78 are formed simultaneously of, for example, aluminum.

Although the characteristics of the reference diode of FIG. 12 are defined by the junction 70 of the anode and cathode regions 68 and 60, the noise is produced by the surface junction 74 of regions 68 and 74. Thus, the removal of the thick oxide and growing thin oxide and a shield layer reduces the noise even of a buried junction diode. The present invention is especially effective for diodes designed to operate in the 5 to 7 volt breakdown range. In this range, both tunnelling and avalanche phenomena are occuring. While the buried junction is broken down or conducting, the surface junction is on the knee of the current-voltage curve and fluctuates causing the noise modulation on the wave form.

Figure 13:
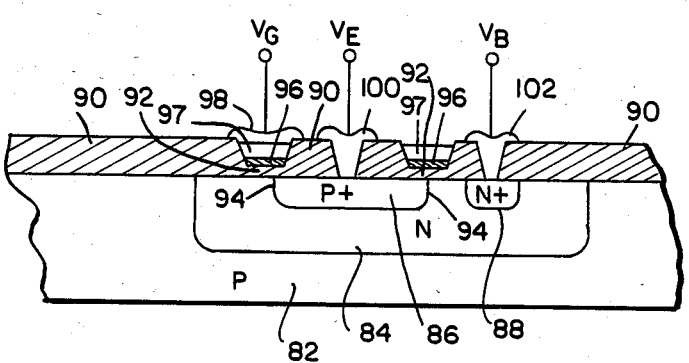
FIG. 13 is a cross-sectional view of a transistor incorporating the principles of the present invention.

The application of the present invention to forward biased junctions has also been found to be significant. A vertical transistor as illustrated in FIG. 13 includes a P type collector 82 having formed therein an N type base 84 which has a P type emitter region 86 formed therein. An N+ base contact 88 is formed in the base region 84. The surface of the substrate is covered by a field oxide 90 having apertures therein. A thin oxide layer 92 is provided at the surface junction of the emitter base regions 86 and 84 and extends outside the emitter and base regions. A shield layer 96 is provided on the thin oxide 92 and is covered by an oxide layer 97. A metal gate layer 98 provides a contact to the shield layer 92 through oxide layer 97 outside the emitter and base regions. Metal contact 100 provides contact to the P+ emitter region 86 through an aperture in the thick oxide 90 and metal contact 102 forms the base contact to the N+ base contact region 88 also through an aperture in the thick oxide 90. A metal contact is also made to the collector region 82 but is not shown for sake of clarity. The device of FIG. 13 is formed by the process described for FIGS. 1 through 8.

Figure 14:
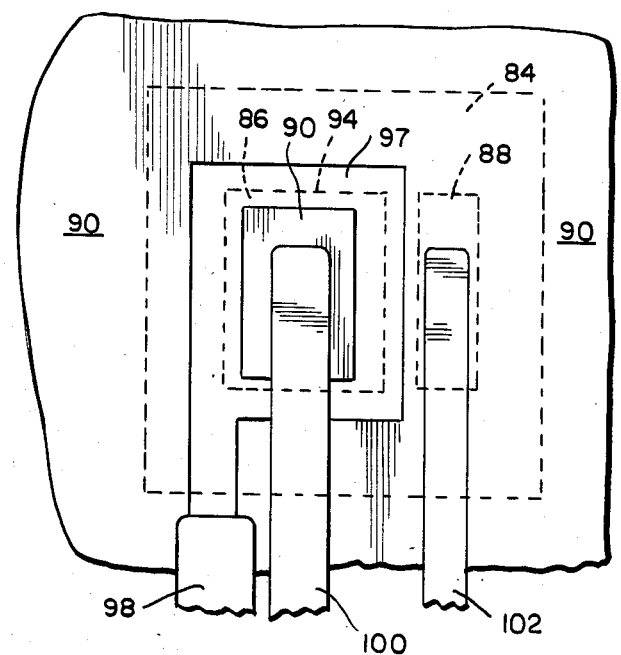
FIG. 14 is a top view of the transistor of FIG. 13.

FIG. 14 illustrates the topography of the chip allowing the metal contacts, which are shown in various types of dash lines, to connect the emitter, base and gate separately while allowing the gate to completely encompass the emitter-base junction. Since the thick oxide 90 is thicker than the combination of the thin oxide 92 and the shield 96, the oxide layer 97 covers the shield 96 without extending substantially above the thick oxide 90. Thus, the emitter metal contact 100 can pass over the thin oxide and shield layer without contact. In prior art devices, a dual metal layer system had to be used which limited the type of devices that could be protected using a continuous ring. Thus, the present invention can be made in linear processes wherein only a single interconnect system or metalization is used.

Experiments have found that the removal of the field oxide and formation of thin oxide with the shield region for a PNP transistor substantially reduces the noise and that biasing the shield region has little or no effect on the low frequency noise level of the forward bias emitter-base junction. For NPN transistors formed to the configurations of FIG. 13, the biasing of the gate produces a substantial effect on the noise level in addition to cleaning the surface by growing new thin oxide and shield region. The noise effect is substantially reduced at low currents. For an NPN transistor, it has been found that the shield or gate region should be biased more negative than the emitter region relative to the base region. The biasing, in addition to the formation of the thin oxide to clean the surface, substantially reduces the low frequency noise. Since PNP transistors have lower betas, they are more sensitive to noise at low currents. The method of fabrication of the present invention improves the emitter efficiency by removing contaminants and crystal defects in the base-emitter depletion layer and controls the recombination-generation of carriers in the surface space-charge region which contribute to surface leakage currents.

Thus it can be seen that the method of fabrication of the present invention may be applied to forward biased diode junctions to reduce the noise as well as forward biased transistor junctions.

From the preceding description of the preferred embodiment it is evident that the objects of the invention are attained and that a process is provided which is compatible with general device processing to produce low surface noise reference diodes and vertical transistors. Although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A method of fabricating a diode comprising:
   forming a P region and an N region in the surface of a substrate to be contiguous along a vertical diode junction extending down from said surface;
   oxidizing said surface to form a thick oxide;
   removing portions of said thick oxide to expose only said vertical junction and immediately adjacent arears of said P region and said N region at said surface and to remove contaminants;
   forming a thin oxide layer on said exposed surface; and
   forming a contaminant shield layer on said thin oxide over said vertical junction at said surface to protect said diode vertical junction.

2. The method according to claim 1 wherein said P and N regions are formed to be contiguous only along a substantially vertical plane.

3. The method according to claim 2 wherein said P and N regions are formed to have an impurity concentration which defines a breakdown voltage in the range of 5 to 7 volts.

4. The method according to claim 2 wherein said shield layer is formed of a conductive material.

5. The method according to claim 4 including forming conductive contacts to said P and N regions distinct from a contact to said shield layer.

6. The method according to claim 1 wherein said N region is formed first and said P region is formed in and encompassed by said N region.

7. The method according to claim 6 wherein said shield layer is formed of a conductive material.

8. The method according to claim 7 including forming conductive contacts to said P and N regions and said shield layer.

9. The method according to claim 8 including forming a conductive interconnect between said shield layer and P region contact.

10. The method according to claim 6 wherein said N and P regions are formed to have an impurity concentration which defines a breakdown voltage in the range of 5 to 7 volts.

11. The method according to claim 1 wherein said P region is formed first and said N region is formed in and encompassed by said P region.

12. The method according to claim 11 wherein said shield layer is formed of a conductive material.

13. The method according to claim 12 including forming conductive contacts to said P and N regions and said shield layer.

14. The method according to claim 13 including forming a conductive interconnect between said shield layer and N region contact.

15. The method according to claim 1 wherein said thin oxide is formed to a thickness in the range of 500 to 1500 angstroms.

16. The method according to claim 15 wherein said shield layer is formed of a doped polycrystalline semiconductor material.

17. The method according to claim 15 wherein said shield layer is formed of aluminum.

18. A method of fabricating a buried diode comprising:
  forming a first region of a first conductivity type in a surface of a substrate of said first conductivity type and having a greater impurity concentration than said substrate;
  forming a second region of a second conductivity type opposite said first conductivity type over the surface of said first region and having a greater lateral area than said first region, the junction of said first and second regions being displaced from the surface of said substrate and form a vertical diode junction;
  oxidizing said surface to form a thick oxide;
  removing portions of said thick oxide to expose the vertical surface junction of said second region and said substrate and to remove contaminants;
  forming a thin oxide layer on said exposed surface; and
  forming a contaminant shield layer on said thin oxide over said vertical junction at said surface to protect said diode vertical junction.

19. The method according to claim 18 wherein said shield layer is formed of a conductive material for forming a conductive layer.

20. The method according to claim 19 including forming a contact to said second region and an interconnect between said second region contact and said conductive layer.

21. The method according to claim 18 wherein said first and second regions are formed to have an impurity concentration which defines a breakdown voltage across said displaced junction in the range of 5 to 7 volts.

22. The method according to claim 18 wherein said thin oxide is formed to have a thickness under 2,000 angstroms.

23. A method of fabricating a vertical bipolar transistor comprising:
  forming a base region in a surface in a collector region;
  forming an emitter region in the surface of said base region having a vertical junction;
  covering the surface with a thick oxide;
  removing portions of said thick oxide to expose a vertical portion of the emitter-base vertical junction at said surface;
  forming a thin oxide layer on said exposed surface; and
  forming a contaminant shield layer on said thin oxide over said vertical junction at said surface.

24. A method according to claim 23 wherein said thin oxide and said shield layer are formed to have a thickness in combination less than the thickness of the thick oxide and to be encompassed laterally by said thick oxide.

25. A method according to claim 24 wherein said thin oxide and shield layer are formed to totally encompass said emitter regions and including forming an insulation layer over said shield layer.

26. A method according to claim 25 including removing portions of said thick oxide to expose portions of said emitter, base and collector regions and said insulation layer to expose portions of said shield layer, forming conductive contacts to said emitter, base and collector regions through said thick oxide and a conductive contact to said shield layer distinct from said emitter, base and collector contacts.

27. The method according to claim 26 wherein said shield layer is formed of a doped polycrystalline semiconductor material and said contact are formed of a metal material.

* * * * *